United States Patent [19]

Shibukawa et al.

[11] Patent Number: 4,570,219
[45] Date of Patent: Feb. 11, 1986

[54] CMOS CIRCUIT WITH REDUCED POWER DISSIPATION AND A DIGITAL DATA PROCESSOR USING THE SAME

[75] Inventors: Masaru Shibukawa, Choufu; Hideo Nakamura, Nishitama; Kiyoshi Matsubara, Koganei, all of Japan

[73] Assignee: Hitachi, Ltd., Tokyo, Japan

[21] Appl. No.: 437,674

[22] Filed: Oct. 29, 1982

[30] Foreign Application Priority Data

Nov. 11, 1981 [JP] Japan ................. 56-179692

[51] Int. Cl.⁴ ..................... G06F 1/04; G06F 9/22
[52] U.S. Cl. ............................. 364/200; 364/707
[58] Field of Search ............. 307/540, 542, 544, 555, 307/557, 450–453, 481, 605, 606; 364/200 MS File, 900 MS File, 707

[56] References Cited

U.S. PATENT DOCUMENTS

| | | | |
|---|---|---|---|
| 4,134,073 | 1/1979 | MacGregor | 307/606 |
| 4,137,563 | 1/1979 | Tsunoda | 364/200 |
| 4,164,666 | 8/1979 | Hirasawa | 307/208 |
| 4,218,876 | 8/1980 | Hashimoto | 364/707 |
| 4,241,418 | 12/1980 | Stanley | 364/900 |
| 4,267,577 | 5/1981 | Hashimoto | 364/707 |
| 4,316,247 | 2/1982 | Iwamoto | 364/200 |
| 4,434,465 | 2/1984 | McDonough | 364/200 |

Primary Examiner—James D. Thomas
Assistant Examiner—Florin Munteanu
Attorney, Agent, or Firm—Antonelli, Terry & Wands

[57] ABSTRACT

In an information processor employing a CMOS circuit comprising a first inverter constructed of CMOS field effect transistors and performing a dynamic operation in response to clock signals, and a second inverter which receives an output from the first inverter and which is also constructed of CMOS field effect transistors, the supply of clock signals to the first inverter is stopped in response to a particular microinstruction. After the supply of clock signals is stopped, the output voltage of the first inverter is clamped to a predetermined value, thus reducing the power dissipation in the dynamic CMOS circuit and also preventing the deterioration of data during the stopping of clock signals.Y 5 Claims, 8 Drawing Figures

CMOS CIRCUIT WITH REDUCED POWER DISSIPATION AND A DIGITAL DATA PROCESSOR USING THE SAME

BACKGROUND OF THE INVENTION

The present invention relates to a MOS circuit suited for lowering power dissipation. More particularly, it relates to a CMOS circuit which can lower power dissipation in the non-operating state, and also to an information processor using the same.

Figure 1:
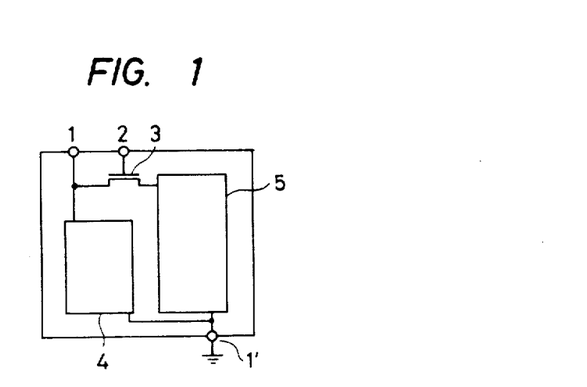
FIG. 1 shows an example of a prior-art CMOS circuit which reduces power dissipation by switching a supply voltage.

Heretofore, methods for reducing power dissipation in an information processor constructed of a large-scale integrated circuit, e.g., a microcomputer, have included a method wherein the supply of electric power to a circuit is stopped for a period during which that circuit need not operate, and a method wherein the clock frequency is lowered or the supply of clock pulses is stopped in the case of a circuit, such as a CMOS circuit, in which the power dissipation is proportional to the clock frequency. Regarding the first method for realizing the stopping of the power supply, a measure as shown in FIG. 1 is sometimes taken in which a path for electric power supply to the interior is disconnected through a switching circuit 3 that is controlled by a signal from a terminal 2. A block 4 in the figure is a circuit which is operating at all times, and a block 5 is a circuit to which the electric power supply is stopped when it need not operate. Electric power is dissipated when current has flowed from a power source terminal 1 to a ground terminal 1'. Therefore, when the operation of the block 5 is unnecessary, the switching element 3 is brought into the turn-off state by the control signal 2, thereby to cut off the path which extends from the terminal 1 to the terminal 1' through the block 5. Thus, the reduction of the power dissipation is achieved. In this case, there are involved such problems that all the contents of a storage device included in the block 5 are destroyed, that the supply of voltage to the block 5 lowers due to the resistance etc. possessed by the switching element 3, and that a period of time in the unit of milliseconds is taken until the electric power supply is stabilized at recovery, so the response becomes slow.

There will now be discussed the method which lowers the clock frequency or stops the supply of clock pulses in a CMOS circuit. In contrast to the foregoing method of stopping the electric power supply, this method is free from the problems of the lowering of the supply voltage and the slow response at recovery. Moreover, the stored contents are protected when all circuits constituting a system are static circuits.

The power dissipation of the CMOS circuit is broadly classified into a component attributed to a quiescent current which flows from the side of a p-type field effect transistor (pMOS) to the side of an n-type field effect transistor (nMOS) in such a manner that both the pMOS and the nMOS are in their "on" states temporarily when an input signal has changed, and a component attributed to a charge/discharge current into or from a capacitive load coupled to the output end of the circuit. Since the quiescent current is, in general, one or more orders smaller than the charge/discharge current, the latter may be regarded as determining the power dissipation of the CMOS circuit. Now, letting $C_i$ denote the output capacitance of the i-th in the circuit system, $f_i$ denote the frequency at which the output of the circuit changes, and V denote the supply voltage, the power dissipation P of this system becomes:

$$P = \sum_i C_i V^2 f_i$$

It is accordingly understood that the output change frequency $f_i$ may be lowered in order to reduce the power dissipation P. To the end of lowering the individual output change frequencies $f_i$, the clock frequency of the circuit system may be lowered.

The MOS circuit is classified into a static circuit in which the voltage level of the input/output signal of a circuit comprised therein is definite even when no signal changes, and a dynamic circuit whose logic is activated by a clock pulse.

In general, when it is intended to achieve the same function as that of a logic circuit including dynamic MOS circuits, by the use of a logic circuit consisting entirely of static MOS circuits only, the number of elements becomes larger in the case of realizing the logic circuit with only the static circuits. In integrated circuits, the scale of integration has enlarged. Moreover, the scale of a circuit to be mounted thereon has enlarged still more. From the viewpoint of the number of elements, therefore, the dynamic circuits need to be used.

Figure 2A:
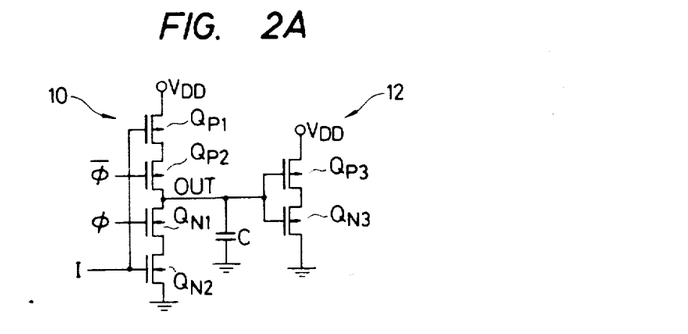
FIGS. 2A and 2B are a diagram of a CMOS dynamic inverter circuit and a time chart of the operations thereof, respectively.
Figure 2B:
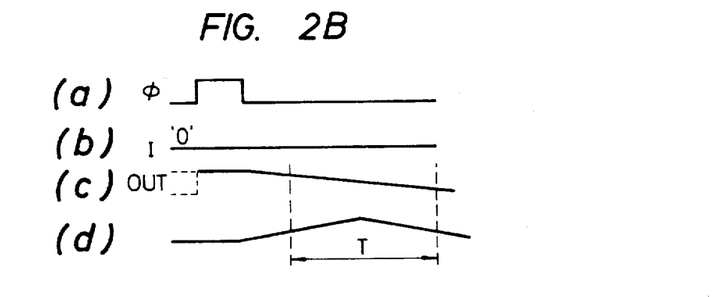

With the dynamic circuit employing CMOS transistors, however, when the clock frequency is lowered with the objective of reducing the power dissipation attendant upon charge/discharge, the problem occurs that the quiescent current increases to augment the power dissipation attendant thereupon. FIG. 2A shows a dynamic inverter circuit 10 which employs CMOS transistors. The circuit 10 is constructed of a series connection which consists of two pMOS's $Q_{P1}$ and $Q_{P2}$ and two nMOS's $Q_{N1}$ and $Q_{N2}$. An input signal I is applied to the gates of the transistors $Q_{P1}$ and $Q_{N2}$, while a clock $\phi$ and a clock $\bar{\phi}$ obtained by inverting the former are respectively applied to the gates of the transistors $Q_{N1}$ and $Q_{P2}$. When the clock $\phi$ at "1" (high level) and $\bar{\phi}$ is at "0" (low level), a signal OUT which is opposite in polarity to the input signal I is provided, and when $\phi$ becomes "0" and $\bar{\phi}$ becomes "1", the status of the circuit before the changes of these clocks is retained. In this circuit, when the supply of the clocks is stopped and the status corresponding to $\phi$ of "0" and $\bar{\phi}$ of "1" is held, the pMOS $Q_{P2}$ and nMOS $Q_{N1}$ which receive these clocks as gate signals fall into "off"states, and the output is in a floating state and holds an output voltage level with charges stored before. As long as the condition of stopping the clocks continues, the charges stored in an output capacitance C are gradually discharged as a leakage current. Therefore, the signal OUT shifts to a voltage level intermediate between "1" and "0" as illustrated in (c) of FIG. 2B. When, at this time, the output OUT of the dynamic circuit is connected to the input of a static inverter circuit 12, an input voltage to this inverter circuit 12 becomes the intermediate level, so that a pMOS $Q_{P3}$ and an nMOS $Q_{N3}$ fall into "on" states simultaneously, and a quiescent current flows through both the transistors for a long period of time T as illustrated in (d) of FIG. 2B. As a result, the quiescent current which is negligible with respect to the charge/discharge current during the normal operation cannot be ignored, and the power dissipation, as a whole, becomes greater than that attributed to the charge/discharge current during the operation. The prevention of the quiescent current during the cessation of the supply of the clocks is accordingly desirable in case of relieving the power dissipation by the control of the clock supply in the microcomputer which employs the CMOS transistor circuit.

At the very beginning, in the case where the control of the clock supply is applied to the microcomputer, it is desirable that the control of timings for starting and stopping the supply of the clocks can be simply performed.

SUMMARY OF THE INVENTION

It is accordingly an object of the present invention to provide a low-power-dissipation CMOS circuit which includes an inverter constructed of CMOS field effect transistors for performing a dynamic operation, and also an information processor which employs such circuit.

Another object of the present invention is to provide a CMOS circuit in which, when clocks have been stopped, a quiescent current is prevented from flowing through a second inverter constructed of CMOS transistors and and which receives an output from the aforementioned inverter, whereby power dissipation is reduced, and also an information processor which employs such circuit.

Still another object of the present invention is to provide an information processor controlled by a microprogram, especially a microcomputer, in which the start and stop of the supply of clocks can be simply controlled, whereby power dissipation can be reduced.

In order to accomplish these objects, according to the present invention, a circuit preventive of a quiescent current during the time the supply of a clock signal is stopped comprises a first inverter which is constructed of CMOS field effect transistors and which performs a dynamic operation, a second inverter which receives an output from said first inverter and which is constructed of CMOS field effect transistors, means for controlling the supply of the clock signal to said first inverter, and means for clamping the output voltage of said first inverter at a predetermined value in response to the stopping of the supply of the clock signal to said first inverter.

In addition, in order to realize a simple control of the timings for stopping and restarting the supply of the clock signal, an information processor comprises clock signal supply-control means for stopping the supply of the clock signal in response to a specified microinstruction and for restarting the supply of the clock signal in response to an interrupt signal.

DETAILED DESCRIPTION OF THE PREFERRED EMBODIMENTS

Figure 3:
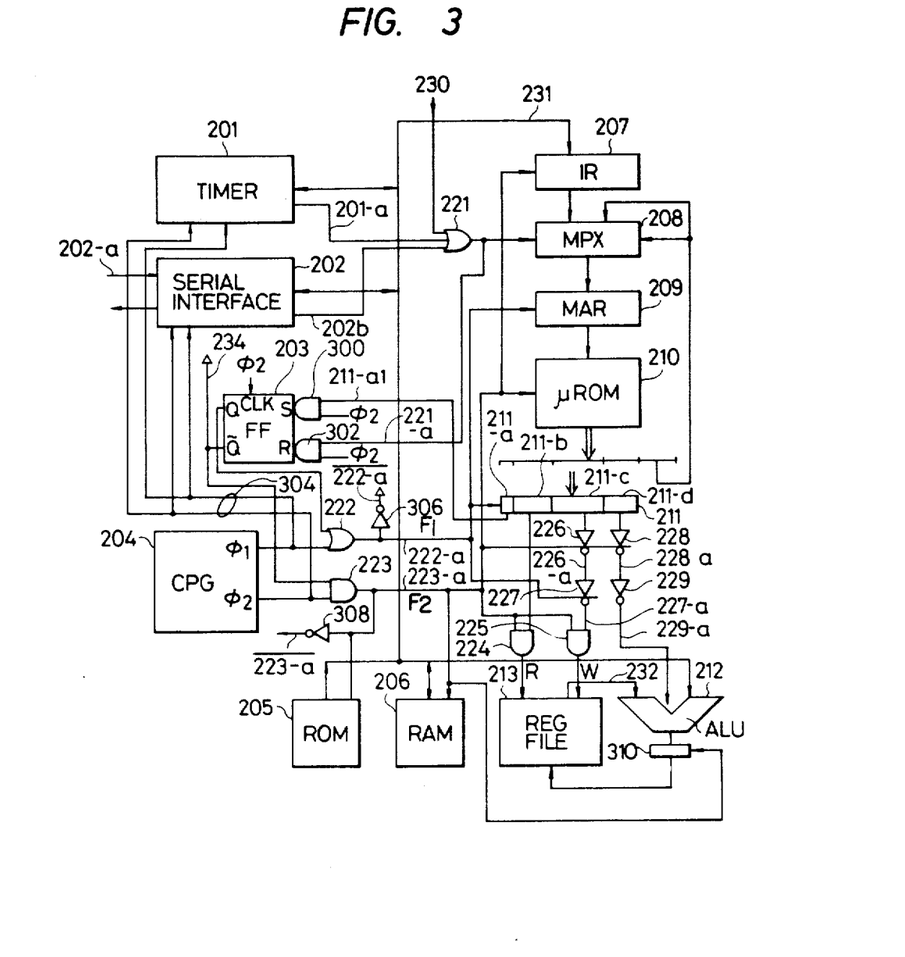
FIG. 3 is a general block diagram of a microcomputer according to the present invention.

FIG. 3 shows a microcomputer which employs a CMOS circuit according to the present invention.

A processor portion consists of an instruction register (IR) 207, a multiplexer (MPX) 208, a microinstruction address register (MAR) 209, a ROM storing microinstructions ($\mu$ROM) 210, a control register 211, an arithmetic logic unit (ALU) 212, a register file 213, a read-only memory for storing machine instructions (ROM) 205, and a random access memory for storing data (RAM) 206. The register file 213, the ALU 212, etc. are controlled by microinstructions loaded in the control register 211. Connected to the control register 211 are inverters 226–229 which serve to give the respective fields of the microinstruction unequal delay times as will be stated later. The apparatus of FIG. 3 further includes a timer 201, a serial data interface 202, and a clock pulse generator (CPG) 204 for a clock $\phi_1$ and a clock $\phi_2$ which do not overlap each other (refer to FIG. 4).

The timer 201, serial data interface 202, ROM 205, RAM 206, ALU 212 and IR 207 are interconnected through a bus 231.

The apparatus is mostly constructed of CMOS static circuits in consideration of low power dissipation and easy circuit design. The delaying inverters 226–228, however, are constructed of CMOS dynamic circuits in order to reduce the number of circuit elements.

After having executed a machine instruction sequence, the present embodiment stops the supply of the clocks to the processor portion in order to lower the power dissipation. The supply of the clocks is thereafter restarted when an interrupt signal has been generated. To this end, the supply of the clocks is performed in two separate aspects. The clocks $\phi_1$ and $\phi_2$ are continuously supplied from the CPG 204 through lines 304 to the timer 201 and the serial data interface 202 which are relevant to the generation of the interrupt.

During the normal operation, the ROM 205, RAM 206, register file 213, IR 207 and $\mu$ROM 210 are supplied with the clock $\phi_2$ provided from the CPG 204, through an AND gate 223 as well as a line 223-a, while the microinstruction address register (MAR) 209 and control register 211 are supplied with the clock $\phi_1$ provided from the CPG 204, through an OR gate 222 as well as a line 222-a. On the other hand, the stopping of the clocks is effected in such a way that, as will be described later, the outputs of the OR gate 222 and the AND gate 223 are held at fixed levels by the function of a flip-flop (FF) 203. The output signals of the OR gate 222 and the AND gate 223 are denoted by "F$_1$" and "F$_2$", respectively. The signals F$_1$ and F$_2$ are the same as the clock pulses $\phi_1$ and $\phi_2$ during the normal operation, while they become different from the clock pulses $\phi_1$ and $\phi_2$ at the time when the supply of these clock pulses should be stopped.

Inverters 306 and 308 invert the signals F$_1$ and F$_2$ on the lines 222-a and 223-a, and deliver the inverted signals F$_1$ and F$_2$ onto lines 222-a and 223-a, respectively. As will be described later, these inverted signals are utilized by the dynamic inverters 226–228.

The present embodiment is characterized by the operations of the apparatus at the times at which the clocks are stopped and restarted. First, the operations of the processor portion during the normal operation will be described with reference to FIG. 4.

Figure 4:
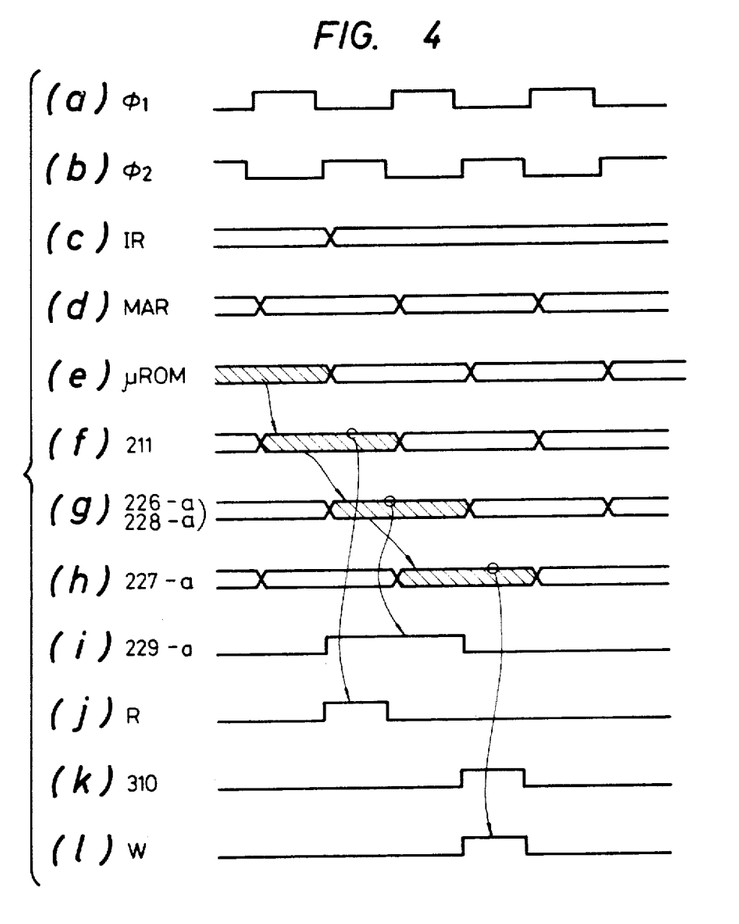
FIG. 4 is an operating timing diagram of a processor portion in FIG. 3.

A machine instruction is fetched from the ROM 205 in synchronism with the rising edge of the clock $\phi_2$ (FIG. 4, (b)), and is set in the IR 207 in synchronism with the rising edge of the clock $\phi_2$ (FIG. 4, (b)). Accordingly, it is at the rising edge of the clock $\phi_2$ that the output of the IR 207 changes (FIG. 4, (c)). For the sake of brevity, a circuit for fetching the machine instruction (for example, a program counter) is not illustrated. As will be described later, the multiplexer 208 is so constructed that, when the machine instruction has been set in the IR 207 anew, it selects the output of an operation code of a machine instruction within the IR 207. That is, the multiplexer 208 is so constructed as to select the operation code from the IR 207, to generate the head microinstruction address of a microinstruction sequence corresponding to the particular operation code, and to transmit the address to the MAR 209. The MAR 209 passes the input from the multiplexer 208 therethrough and delivers it as it is, when the clock $\phi_1$ is at "1" (high level), and it latches the input in response to the falling edge of the clock $\phi_1$ and then delivers it. Accordingly, the output of the MAR 209 changes each time $\phi_1$ rises (FIG. 4, (d)). The $\mu$ROM 210 continues to deliver the microinstruction specified by the MAR 209 at that time, while the clock $\phi_2$ is at the high level, and it latches the fetched microinstruction in synchronism with the falling edge of the clock $\phi_2$ and then transmits it to the control register 211. Accordingly, the output of the $\mu$ROM 210 changes each time the clock $\phi_2$ rises (FIG. 4, (e)). Likewise to the MAR 209, the control register 211 latches the fetched microinstruction in response to the falling edge of the clock $\phi_1$. Accordingly, the output of the register 211 changes each time the clock $\phi_1$ rises (FIG. 4, (f)). The microinstruction consists of five fields, the four fields of which on the left side are stored in fields 211-a to 211-d of the control register. The fields 211-b to 211-d contain information for controlling the register file 213, the ALU 212, etc. The field 211-a is a field which has been added anew in the present invention, and which includes a bit for controlling the stopping of the clocks. This bit is at "0" for ordinary microinstructions as to which the clocks are not stopped. The fifth field of the microinstruction contains the address of the next microinstruction, and it is applied to the multiplexer 208 without passing through the control register 211.

An information indicative of the end of the microinstruction sequence is contained in the fifth field of the last microinstruction in the execution routine of each machine instruction. This fifth field is held in the multiplexer 208, and is used for controlling it. Another signal for controlling the selecting operation of the multiplexer 208 is a signal which is received through an OR gate 221. This signal is the interrupt signal as will be described later. When the microinstruction fetched from the $\mu$ROM 210 is indicating the address of the next microinstruction, the multiplexer 208 selects it. In a case where the fifth field of the microinstruction fetched from the $\mu$ROM 210 is indicating the last of the microinstruction sequence: (1) if an interrupt signal is not received from the OR gate 221 at that time, the multiplexer selects the operation code of the IR 207, and (2) if an interrupt signal is received at that time, the multiplexer generates the start or head address of a microinstruction sequence for interrupt processing and transmits it to the MAR 209. Such a multiplexer has been known. After the microinstruction sequence for the interrupt processing has ended, the first instruction of a machine instruction sequence corresponding to the reason for the interrupt is set in the IR 207. Circuits relevant to these operations are not illustrated because they have been known.

Thus, in the present apparatus, similarly to the prior art, a machine instruction is executed in a microinstruction sequence, the next machine instruction is set from the ROM 205 into the IR 207 each time the sequence ends, and a microinstruction sequence for the machine instruction set anew is executed. In this way, a series of machine instructions are executed. Herein, when an interrupt signal is received at the end of each microinstruction sequence, a microprogram for the interrupt processing is executed in place of the execution of the next machine instruction. In FIG. 3, for the sake of brevity, circuits for fetching the next machine instruction (a program counter, etc.) are omitted.

Here will be explained the operations of the inverters 226-229. The fields 211-b to 211-d of the microinstruction stored in the control register 211 contain various control information as already stated. The control information in these fields are not utilized all at the same time, but they are utilized with timings appropriately shifted. By way of example, in a case where the microinstruction for reading out data in the register file 213, subjecting the data to a desired operation in the ALU 212 and storing the operation result in the register file 213 has been set in the register 211 (an oblique line part in (f) of FIG. 4), control information instructing the read-out of the register file 213 is transmitted from the field 211-b to an AND gate 224, and a read-out command R is delivered to the register file 213 in synchronism with the rising edge of the clock $\phi_2$ (FIG. 4, (j)). Data read out from the register file 213 is transmitted to the ALU 212 through a line 232. An operation command for the ALU 212 is afforded from the field 211-d. That is, the field 211-d is held from the rising edge of the clock $\phi_2$ till the next rising edge by the dynamic inverter 228 (an oblique line part in (g) of FIG. 4). The output 228-a of the inverter 228 is supplied to the ALU 212 through a line 229-a by a static inverter 229 which is disposed in order to invert the polarity of the signal (FIG. 4, (i)). The ALU 212 operates on the data read out from the register file 213, in the period in which the line 229-a is at level "1" (in the period from the rising edge of $\phi_2$ till the next rising edge thereof), whereupon it transmits the result to a buffer register 310. The register 310 latches this result at the rising edge of the clock $\phi_2$ received from the line 223-a, and holds the content during the period during which $\phi_2$ is at "1" (FIG. 4, (k)). The operated result is delivered from the buffer register 310 to the register file 213. An information instructive of a write-down control is delivered to a line 226-a in such a way that the field 211-c is held for one cycle from the rising edge of the clock $\phi_2$ to the next rising edge thereof by the dynamic inverter 226 (the oblique line part in (g) of FIG. 4). Further, the output 226-a of the dynamic inverter 226 is held by the dynamic inverter 227 for one cycle from the rising edge of the clock $\phi_1$ to the next rising edge thereof and is delivered to a line 227-a (an oblique line part in (h) of FIG. 4). The output 227-a of the inverter 227 is applied to an AND gate 225 along with the clock $\phi_2$ sent through the line 223-a, a write-down command W (FIG. 4, (l)) is produced by this gate, and the register file 213 loads the output data of the ALU 212 thereinto at the falling edge of $\phi_2$ and holds it.

Thus, the train of inverters 228 and 229 performs the function of delaying the operation command field 211 for the ALU 212 by a half cycle, while the train of inverters 226 and 227 performs the function of delaying the write-down command field 211-c by one cycle and delivering it to the register file 213.

In order to apply the contents of the control register 211 to the ALU 212, the register file 213, etc. at proper timings in this manner, a large number of trains of inverters are actually disposed. Herein, however, only the two trains of inverters have been shown illustratively.

Now, operations during the stopping of the clocks will be described.

Figure 5:
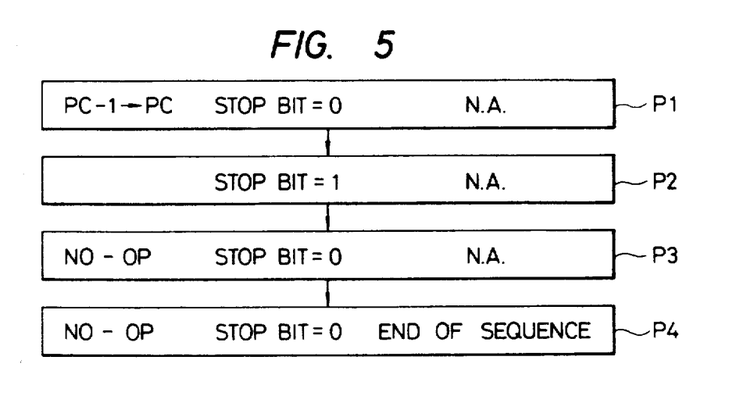
FIG. 5 is a diagram showing the microinstruction sequence of a sleep instruction.

In the present embodiment, an instruction for executing the stopping of the clocks (hereinbelow, called a "sleep instruction") is arranged at the last of a machine instruction sequence. The microinstruction sequence of machine instructions consists of a fetch routine common to the respective instructions, and execution routines peculiar to the respective instructions. The execution routine of the sleep instruction will be explained with reference to FIG. 5. This execution routine is composed of four microinstructions P1-P4. The instruction P1 concerns the control of the program counter (not shown), and performs controls relevant to the fetch routine before the initiation of the clock stopping operation. Since it does not directly relate to the clock stopping operation, it will not be described in detail. The fifth address field of this instruction contains the address N. A. of the next instruction (P2).

Figure 6:
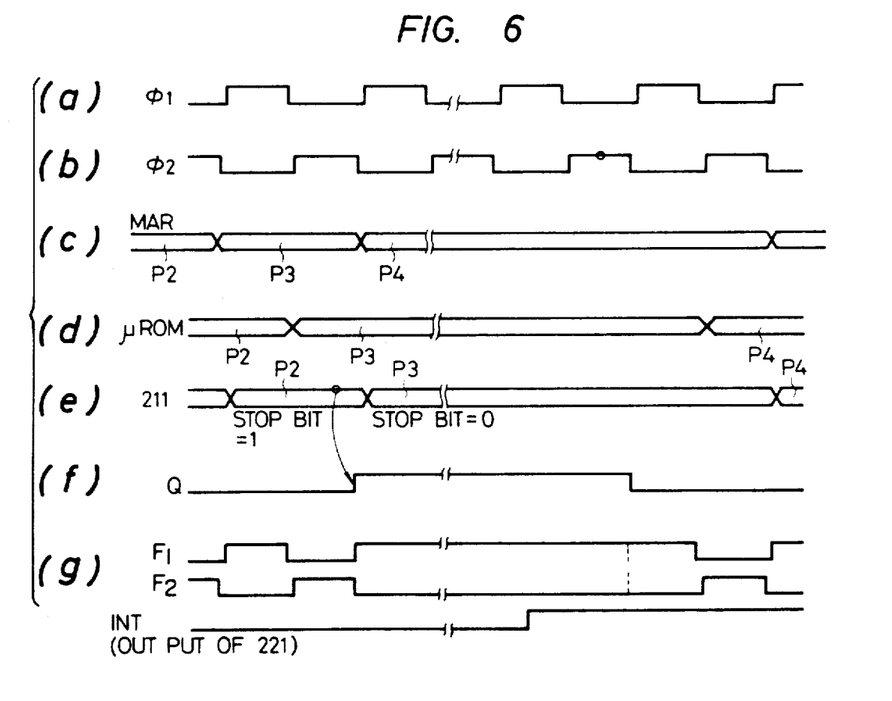
FIG. 6 is a time chart of operations for stopping and restarting the supply of clocks.

On the basis of the next address field of this instruction, the next instruction P2 is fetched from the μROM 210. The control register 211 keeps delivering this instruction P2 from the rising edge of the clock $\phi_1$ till the next rising edge thereof (FIG. 6, (e)). This instruction is a microinstruction instructive of the clock stopping operation, and the clock stop bit of the first field 211-a in the control register 211 is held at "1". The clock stop bit is applied to an AND gate 300. The other input to the gate 300 is the clock $\phi_2$, which is directly supplied from the CPG 204 (a signal line for the supply is not illustrated). Accordingly, the clock stop bit is applied to the set terminal S of the flip-flop (FF) 203 in synchronism with the rising edge of the clock $\phi_2$. The FF 203 is a known master-slave FF, which is supplied with the clock $\phi_2$ directly from the CPG 204 to its clock terminal CLK as an operation control clock (a signal line for the supply is not illustrated). The FF 203 has its internal status changed in response to the input signal at the time at which the clock $\phi_2$ received from the terminal CLK is at "1". It changes its noninverting output Q and its inverting output $\overline{Q}$ in response to the change of the internal status when the clock $\phi_2$ falls. As will be described later, the FF 203 is in the reset status during a normal operation. In the current case, the stop bit "1" of the instruction P2 is applied to the terminal S through the AND gate 300 so as to set the FF 203, and the noninverting output Q of the FF 203 becomes "1" at the falling edge of the clock $\phi_2$ (FIG. 6, (f)). At the same time, the inverting output $\overline{Q}$ becomes "0". The output signal $F_1$ of the OR gate 222 becomes the high level after the falling edge of the clock $\phi_2$ in response to the output Q, while the output signal $F_2$ of the AND gate 223 becomes low level after the falling edge of the clock $\phi_2$ in response to the output $\overline{Q}$ (FIG. 6, (g)). Thus, the supply of the clocks to the processor portion is stopped.

The fifth field of this instruction P2 stores the address N. A. of the next instruction (P3). As already explained, the fifth field of the instruction (P2 in the current example) in the control register 211 has been applied to the MAR 209 through the multiplexer 208 as soon as this instruction has been fetched from the μROM 210. The fetch of the next microinstruction (P3) is started at the rising edge of the clock $\phi_1$. Immediately before the above-stated clock stopping has occurred, accordingly, the address of the instruction P3 is latched in the MAR 209 (FIG. 6, (c)), and the instruction P3 is being fetched from the μROM 210. As described above, at the time at which the clocks $\phi_1$ and $\phi_2$ have been stopped by the instruction P2, the clock $F_2$ on the line 223-a is changed into the low level. Accordingly, the μROM 210 latches the fetched instruction P3 and also delivers it to the control register 211. Thereafter, the level of the clock signal $F_2$ does not change, and hence, the output of the μROM 210 remains the instruction P3 (FIG. 6, (d)). On the other hand, the control register 211 passes the content of the instruction P3 therethrough and delivers it as it is, in response to the fact that the signal $F_1$ is changed to the high level "1" at the clock stopping operation. The output of the μROM 210 remains the instruction P3 during the time the clocks are stopped. Accordingly, the output of the control register 211 remains the instruction P3 (FIG. 6, (e)). During the time the clocks are stopped, there is no level change of the signal $F_1$, and hence, the control register 211 does not latch this instruction P3. The instruction P3 is an instruction for bringing the input to the set terminal of the FF 203 into "0" and resetting the FF 203 through the line 221-a upon generation of the interrupt signal, and a clock stop bit contained in the first field thereof is "0". During the stop of the clocks, accordingly, the AND gate 300 is disabled, and the set input of the FF 203 is held at "0". In addition, this instruction is a non-operating instruction which requires no operation of the register file 213, the ALU 212, etc. and which contains no control information in the fields 211-b to 211-d. In other words, the content of the register file 213 is not changed until the sleep instruction ends. The fifth field of the instruction P3 is transmitted to the multiplexer 208 as soon as this instruction P3 has been fetched from the μROM 210. This fifth field indicates the address of the next instruction P4. Accordingly, the address of the instruction P4 is applied to the MAR 209 through the multiplexer 208. At the stopping of the clocks, the signal $F_1$ is held at the high level, so that the MAR 209 passes the address of the instruction P4 therethrough and delivers it. During the time the clocks are stopped, the output of the μROM 210 does not change, so that the output of the MAR 209 remains the address of the instruction P4 (FIG. 6, (c)). By the way, since the level of the signal $F_1$ does not change, the MAR 209 does not latch the address of the instruction P4.

Thus, during the time the clocks are stopped, the status is held under which the instruction P3 is fetched from the μROM 210, this instruction is delivered from the control register 211 and the address of the instruction P4 is delivered from the MAR 209. The μROM 210, control register 211, MAR 209 and register file 213 are constructed of static MOS circuits. Accordingly, even when no clock is supplied to these circuits, the statuses of the circuits do not change.

The stopping of the clocks reduces power dissipation ascribable to the inverters 226-228, ALU 212 and RAM 206 which are constructed of dynamic circuits.

Meantime, the clocks $\phi_1$ and $\phi_2$ are continuously supplied to the timer 201 and the serial data interface 202. Upon receiving these clocks, the timer 201 performs a timer operation to generate interrupt signals on a line 201-a at regular time intervals. In addition, the serial data interface 202 generates an interrupt signal on a line 202-b when a serial data input has been externally applied thereto through a line 202-a. Further, an interrupt signal can directly be externally applied through a line 230. These interrupt signals are applied to the OR gate 221, the output of which is used for enabling an AND gate 302 through the line 221-a. The AND gate 302 is supplied with the clock $\phi_2$ even while the supply of the clocks $\phi_1$ and $\phi_2$ to the processor portion is stopped. The output of the AND gate 302 is supplied to the reset terminal R of the FF 203. Therefore, after the interrupt signal has been applied to the OR gate 221, the FF 203 is reset in response to the rising edge of the clock $\phi_2$, and its outputs Q and $\overline{Q}$ are inverted by the falling edge of the clock $\phi_2$ (FIG. 6, (f)). Consequently, the normal clocks $\phi_1$ and $\phi_2$ begin to be supplied to the lines 222-a and 223-a from the OR gate 222 and the AND gate 223, respectively. Thus, the execution of the microinstruction sequence is started in the processor portion again. At this time, the remaining microinstructions of the microinstruction sequence for the sleep instruction are executed. First, the clocks $\phi_1$ and $\phi_2$ begin to be supplied onto the lines 222-a and 223-a. When $\phi_1$ has become "0" and $\phi_2$ "1", the control register 211 which was performing the through operation during the stopping of the clock supply latches the already fetched microinstruction P3, and the MAR 209 latches the already received address of the instruction P4. On the other hand, the $\mu$ROM 210 provides the instruction P4 on the basis of the address thereof received from the MAR 209 (FIG. 6, (d)). Since the respective fields of the instruction P3 in the control register 211 contain information which does not start the register file 213 or the ALU 212, the status thereof does not change and the execution of the next microinstruction P4 is shifted to. Since, however, the next instruction P4 is the non-operating instruction, it does not change the status, either. The address information of the fifth field of the microinstruction P4 indicates the end of the microinstruction sequence of the sleep instruction. Subject to this information and the condition that the interrupt is received through the OR gate 221, the multiplexer 208 generates the head address of the microinstruction sequence of the interrupt processing (a circuit for the generation is not shown) and sets it in the MAR 209 so as to shift the operation to the microinstruction sequence of the interrupt processing.

In the manner described above, the stopping and restarting of the clocks are carried out.

Figure 7:
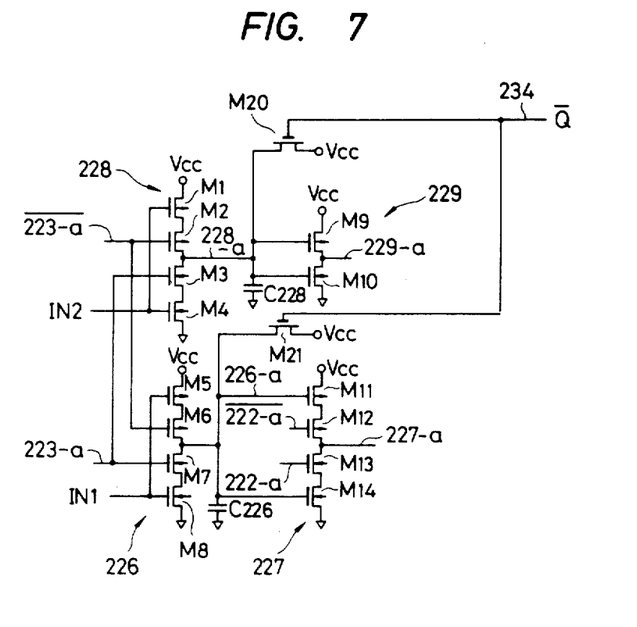
FIG. 7 is a circuit diagram of dynamic inverters for delaying timings.

FIG. 7 shows the practicable circuit arrangement of the dynamic inverters 226–228 and the static inverter 229. The inverter 226 is constructed of a series connection consisting of transistors M5–M8, the inverter 227 is constructed of a series connection consisting of transistors M11–M14, the inverter 228 is constructed of a series connection consisting of transistors M1–M4, and the inverter 229 is constructed of a series connection consisting of transistors M9 and M10. The transistors M1, M2, M5, M6, M9, M11 and M12 are pMOS's, whereas those M3, M4, M7, M8, M10, M13 and M14 are nMOS's. The gates of the transistors M3 and M7 are supplied through the line 223-a with the clock $\phi_2$, the gates of the transistors M2 and M6 are supplied through a line 223-a with the inverted clock $\overline{\phi_2}$ of the clock $\phi_2$ on the line 223-a, the gate of the transistor M13 is supplied through a line 222-a with the clock $\phi_1$, and the gate of the transistor M12 is supplied through a line 222-a with the inverted signal $\overline{\phi_1}$ of the clock $\phi_1$ on the line 222-a. In this manner, the inverters 226 and 227 receive different clocks. An input IN1 from the field 211-c of the control register 211 is applied to the gates of the transistors M5 and M8, while a input IN2 fromthe field 211-d of the control register 211 is applied to the gates of the transistors M1 and M4. The node between the transistors M6 and M7 is connected through the line 226-a to both the gates of the transistors M11 and M14. On the other hand, the node between the transistors M2 and M3 is connected through the line 228-a to the gates of the transistors M9 and M10. In the figure, a capacitor C226 represents stray capacitances coupled to the line 226-a, and a capacitor C228 represents stray capacitances coupled to the line 228-a.

The respective inverters 226 and 228 deliver the inverted signals of the inputs IN1 and IN2 to the lines 226-a and 228-a when the clock $\phi_2$ is at the high level, and they hold their previous outputs when the clock $\phi_2$ is at the low level. When the clock $\phi_1$ is at the high level, the inverter 227 provides a signal obtained by inverting the output of the inverter 226 at that time, and when the clock $\phi_1$ is at the low level, it holds its previous output. Thus, while the clocks are being supplied, the inverters 226, 227 and 228 provide the signals with the input signals delayed by a half cycle, respectively. In contrast, the inverter 229 which is the static inverter delivers the inverted signal of the signal on the line 228-a to the line 229-a without delay. This inverter 229 is disposed in order to generate the signal having the same polarity as that of the input IN2. In this manner, by connecting the dynamic inverters in series in a plurality of stages, the signals of the respective fields of the control register 211 can be delivered after delaying them by proper periods of time in half-cycle units. Moreover, while the clocks are stopped, the outputs of the dynamic inverters do not change (the output capacitors C226 and C228 are not charge/discharged), so that the power dissipation in these inverters can be reduced. In this case, however, the following problem can occur. During the time the clocks are stopped, the signals $F_1$ and $\overline{F_2}$ on the lines 222-a and 223-a are at "1", and the signals $F_2$ and $\overline{F_1}$ on the lines 223-a and 222-a are at "0". In the dynamic inverters 226 and 228, the pMOS's M6 and M2 have clock inputs of "1" and the nMOS's M7 and M3 have clock inputs of "0", and these transistors M2, M3, M6 and M7 are in the "off" states. Accordingly, the lines 226-a and 228-a hold the outputs before the stopping of the clocks (the quantities of charges stored in the capacitors C226 and C228). Conversely, in the dynamic inverter 227, both the pMOS M12 and the nMOS M13 receiving the signals $\overline{F_1}$ and $F_2$ fall into the "on" states. The inverter 227 therefore performs the same operation as that of the static inverter 229. That is, the inverter 227 delivers the inverted signal of the input 226-a to the line 227-a without delay. When this status continues for a long time, the charges stored in the capacitors C226 ad C228 decrease gradually due to leakage currents. That is, the voltage level of the line 226-a or 228-a lowers gradually to become a voltage level intermediate between the voltage levels "0" and "1". At this time, all the transistors M9, M10, M11 and M14 become the "on" states, and quiescent currents flow through the inverters 227 and 229, with the result that the power dissipation increases.

In the present invention, accordingly, pMOS's M20 and M21 for clamping the output levels at "1" during the time the clocks are stopped are connected to the output lines 226-a and 228-a of the dynamic inverters 226 and 228 whose transistors receiving the clocks are in the "off" states during that time. The gates of these transistors are connected to the output terminal $\overline{Q}$ of the FF 203 (FIG. 3) through a line 234. Both the transistors M20 and M21 are in the "off" states in the status in which the clock supply is not stopped, in other words, when the inverting output $\overline{Q}$ of the FF 203 is "1". Therefore, they do not change the outputs of the dynamic inverters 226 and 228. When the sleep instruction has been executed at the end of the machine instruction sequence, the noninverting output Q of the FF 203 becomes "1" and the inverting output $\overline{Q}$ becomes "0", the gate inputs of the transistors M20 and M21 become "0" to bring both the transistors into the "on" state, and the lines 226-a and 228-a are connected to a power source line $V_{CC}$ through the transistors M20 and M21 and hold the high level statuses. Since the aforementioned level is held during the period when the clocks are stopped, the foregoing quiescent currents can be prevented. At this time, the outputs of the inverters 227 and 229 are at the "0" level.

For the prevention of the quiescent currents, the clamp level may be a level which does not simultaneously turn "on" the transistors M11 and M14 or those transistors M9 and M10. Concretely, it may be either the supply voltage $V_{CC}$ or the earth potential. The selection of either the supply voltage or the earth voltage is desirable in order that the malfunction of the apparatus at the restarting of the clocks may be preventable.

When the clock supply is restarted by the interrupt as described before, the inverting output $\overline{Q}$ of the flip-flop FF 203 changes to "1". In response to this change, the transistors M20 and M21 fall into the "off" states. The microinstruction P3 to be executed at this time is held stored in the control register 211, and the field 211-b is afforded to the register file 213 through the AND gate 224. When the clock $\phi_2$ has become "1" for the first time after the starting of the clock supply, the AND gate 224 is enabled for the first time. At this time, however, the instruction P3 is the non-operating instruction, so that the read-out signal R is not generated.

The field 211-d is supplied to the ALU 212 through the inverters 228 and 229 when the clock $\phi_2$ on the line 223-a has become high level for the first time after the starting of the clock supply. Since the instruction P3 is the non-operating instruction, the ALU 212 is supplied with no control signal at this time. On the other hand, when the clock $\phi_2$ is at the "0" level after the restarting of the clocks, the ALU 212 is supplied with no control signal because the clamp voltage of the output line 228-a of the inverter 228 is selected at the supply voltage so that the output of the inverter 229 during the time the clocks are stopped may be the "0" level.

The field 211-d is delayed by one cycle by means of the dynamic inverters 226 and 227, and is supplied to the register file 213 through the AND gate 215. Accordingly, when the clock $\phi_2$ on the line 223-a has become "1" for the second time after the restarting of the clock supply, the field 211-d of the instruction P3 is supplied to the register file 213. Since, however, this instruction is the non-operating instruction, no write-down signal W is generated. The AND gate 225 is enabled also when the clock $\phi_2$ on the line 223-a has become "1" first after the clock supply. At this time, the signal level of the input line 227-a to the AND gate 225 is the inverted level of that level of the signal line 226-a which was clamped during the clock stop. Since the clamp level of the line 226-a is selected at the supply voltage in the current example, the write-down signal is not provided from the AND gate 225 even when the clock $\phi_2$ has become "1" first, either.

In this manner, the clamp level by the MOS transistors during the time the clock supply is stopped is determined to be the level which prevents any erroneous control signal from being supplied to the register file 213, the ALU 212, etc. before the information of the microinstruction are reliably transmitted thereto properly after the restarting of the clock supply. Thus, any malfunction attendant upon the starting of the clock supply can be prevented.

According to the present invention, the reduction of power dissipation can be achieved merely by the control of a clock circuit without stopping the supply of electric power. This brings forth the effect that low power in the non-operating state can be realized without degrading the responsibility at restarting and the voltage margin. Moreover, the provision of an initialization sequence at the restarting dispenses with the retention of previous statuses and permits the destruction of those contents of storage elements which need not be held at the restarting.

What is claimed is:

1. An information processor wherein respective machine instructions are executed in microinstruction sequences in synchronism with clock signals; said information processor comprising: a memory which stores said microinstruction sequences therein; a control register which serves to hold the microinstructions fetched from said memory; processing means including an arithmetic logic unit for processing data; means for supplying said processing means with the microinstructions held in said control register including a delay circuit which serves to afford unequal delay times to respective parts of the microinstruction supplied from said control register; a generator for the clock signals; a generator circuit for supplying an interrupt signal; a first circuit which normally supplies the clock signals to the interrupt signal generator circuit; and a second circuit which controls the supply of the clock signals to said memory, said control register and said arithmetic logic unit; said delay circuit including a plurality of inverter trains in which unequal numbers of inverter stages for affording the unequal delay times are connected in series, said inverter trains including inverters which perform dynamic operations in response to the clock signals, said second circuit including means for stopping the supply of the clock signals in response to a specific microinstruction within a microinstruction sequence for a predetermined specific machine instruction when said specific microinstruction has been loaded in said control register and for restarting the supply of the clock signals in response to supply of the interrupt signal by said interrupt signal generator circuit.

2. An information processor according to claim 1, wherein said second circuit includes clamp means for clamping ouput voltages of the dynamic inverters at a predetermined value during the time the supply of the clock signals is stopped.

3. An information processor according to claim 2, wherein said clamp means clamps an output voltage of that one of said dynamic inverters whose output is applied to an inverter performing a static operation.

4. An information processor according to claim 3, wherein said inverter performing the static operation is an inverter which performs the static operation during the time the supply of the clock signals is stopped and which performs the dynamic operation during the time of supply of the clock signals.

5. An information processor according to claim 2, wherein said predetermined value is so determined that, at the time at which signals responsive to the clamped predetermined value are delivered to output ends of said inverter trains after the supply of the clock signals has been restarted, said signals do not become any signal which starts said arithmetic logic unit.

* * * * *